United States Patent
Matsui et al.

(10) Patent No.: US 6,794,285 B2
(45) Date of Patent: Sep. 21, 2004

(54) SLURRY FOR CMP, AND METHOD OF MANUFACTURING SEMICONDUCTOR DEVICE

(75) Inventors: Yukiteru Matsui, Yokohama (JP); Gaku Minamihaba, Yokohama (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/706,052

(22) Filed: Nov. 13, 2003

(65) Prior Publication Data

US 2004/0161932 A1 Aug. 19, 2004

(30) Foreign Application Priority Data

Feb. 14, 2003 (JP) .......................... 2003-037179

(51) Int. Cl.[7] .......................... H01L 21/4763
(52) U.S. Cl. .......................... 438/633; 438/692; 438/693
(58) Field of Search .......................... 438/633, 692–693

(56) References Cited

U.S. PATENT DOCUMENTS 6,270,393 B1 * 8/2001 Kubota et al. ................ 451/36

FOREIGN PATENT DOCUMENTS

| JP | 1 167 482 A2 | 1/2002 |
| JP | 2002-012854 | 1/2002 |
| JP | 2002-158194 | 5/2002 |

* cited by examiner

Primary Examiner—Lynne A. Gurley
(74) Attorney, Agent, or Firm—Finnegan, Henderson, Farabow, Garrett & Dunner, L.L.P.

(57) ABSTRACT

There is disclosed a CMP slurry which comprises a solvent, abrasive grains, and a silicone-based surfactant having an HLB value ranging from 7 to 20.

13 Claims, 4 Drawing Sheets

SLURRY FOR CMP, AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2003-037179, filed on Feb. 14, 2003, the entire contents of which are incorporated herein by reference.

BACKGROUND OF THE INVENTION

1. Field of the Invention

The present invention relates to a slurry for CMP and a method for manufacturing a semiconductor device. In particular, the present invention relates to a slurry for CMP which can be employed in the formation of a damascene wiring employed for mounting a high-speed logic LSI, a system LSI, a memory/logic hybrid LSI, etc., and to the method for manufacturing a semiconductor device.

2. Description of the Related Art

Recent years, concomitant with the advancements in the integration of LSI, the wiring pattern is now increasingly miniaturized at a high speed. In particular, in the wiring of the next generation, where the design rule is 0.1 $\mu$m or less, it is considered imperative to develop new materials to prevent RC delay of wirings. Accordingly, it is now studied to employ low resistive Cu (p: 1.8 $\mu\Omega$cm) as a wiring material and to employ a low dielectric constant (k:<2.5) insulating film as an insulating material.

The Cu wiring is mainly employed by forming it as a damascene wiring by using CMP (Chemical Mechanical Polishing). When the polishing of the Cu wiring is performed by CMP, a conductive material existing between wirings can be effectively removed, thus making it possible to obtain a wiring which is less likely to cause short-circuit, as compared with the wiring formed by RIE, such as the conventional Al wirings. Therefore, CMP is considered advantageous in the process of forming fine wirings.

On the occasion of forming the Cu damascene wiring by using the aforementioned CMP process, it is required that the method be capable of providing the wiring with various properties, such as excellent surface planarity, high polishing rate, low density in surface defects, low density in residual impurities and sufficient resistance to film peeling. If an organic insulating film (Low-k film) of low dielectric constant is employed as an interlayer insulating film, it would be possible to secure a high polishing rate. However, the employment of the organic insulating film would be encountered with many difficulties, as compared with the case where the conventional inorganic $SiO_2$ film is employed in realizing all of the aforementioned properties except the high polishing rate.

In particular, with respect to the surface planarity, the loss of the Low-k film (erosion) due to the employment of CMP would become serious. The main reason of this may be attributed to the fact that the mechanical strength of the organic Low-k film is much poorer as compared with the inorganic $SiO_2$ film. Furthermore, since most of the Low-k films contain organic components, the surface thereof is hydrophobic, which means that the hydrophobic surface is poor in compatibility with hydrophilic abrasive grains, thus resulting in the generation of non-uniformity in density of abrasive grains within a wiring pattern.

With a view to perform the polishing of wiring without causing damage to the Low-k film while maintaining a sufficient degree of polishing rate, there has been proposed to employ a slurry containing a fluorine-based surfactant. However, the fluorine-based surfactant is rather expensive and moreover may impose various burdens on the environment, thus rendering the fluorine-based surfactant inconvenient in its handling.

Further, due to the following reasons, it is difficult to sufficiently minimize the density of residual impurities on the surface of the Low-k film.

It is unavoidable to remain undesirable substances such as dusts (abrasive grains and cut pieces) and unreacted slurry on the surface of insulating film and wirings after the treatment using CMP. In the conventional method, these undesirable substances were removed by using a washing solution containing an organic acid or a surfactant. However, as the intervals between wirings are increasingly narrowed these days, such a washing method is no longer useful in removing these undesirable substances. Moreover, since the intervals between wirings demanded in the wirings of the next generation is as fine as 0.1 $\mu$m or less, a small amount of such a very small residual substances that have been disregarded in the prior art as not raising any substantial problem may now become a cause for the generation of wiring defects, such as short circuit between wirings, and the deterioration in voltage resistance of the insulating film.

Additionally, as described above, the surface of the Low-k film is hydrophobic and hence poor in compatibility to water. Therefore, dust is more likely to be adsorbed onto the surface of the insulating film during the treatment thereof using the CMP or during the washing treatment thereof. Moreover, since the dust adsorbed onto the insulating film cannot be removed, it may become a main cause for preventing the formation of wirings which are electrically isolated from each other normally. Furthermore, the Low-k film is accompanied with the drawback that it is vulnerable to scratches.

Additionally, since the Low-k film is inherently poor in adhesive strength, it is impossible in the employment of the Low-k film to secure a sufficiently high degree of resistance to the film peeling, thus making it one of the important and difficult problems that has to be coped with in the integration of Cu/Low-k film.

BRIEF SUMMARY OF THE INVENTION

A CMP slurry according to one embodiment of the present invention comprises:
  a solvent;
  abrasive grains; and
  a silicone-based surfactant having an HLB value ranging from 7 to 20.

A method of manufacturing a semiconductor device according to one embodiment of present invention comprises:
  forming an insulating film above a semiconductor substrate;
  forming a recessed portion in the insulating film;
  depositing a conductive material inside the recessed portion and on the insulating film to form a conductive layer; and
  removing the conductive material deposited on the insulating film by CMP using a CMP slurry to expose the insulating film, the CMP slurry comprising a solvent, abrasive grains and a silicone-based surfactant having an HLB value ranging from 7 to 20.

A method of manufacturing a semiconductor device according to another embodiment of present invention comprises:

forming an insulating film above a semiconductor substrate;

forming a recessed portion in the insulating film;

depositing a conductive material inside the recessed portion and on the surface of the insulating film to form a conductive layer;

removing the conductive material deposited on the insulating film to expose the insulating film while selectively leaving the insulating film deposited inside the recessed portion, thereby forming a buried wiring layer; and treating surfaces of the buried wiring layer and of the insulating film by using a treating solution comprising a silicone-based surfactant having an HLB value ranging from 7 to 20 and dissolved in water.

DETAILED DESCRIPTION OF THE INVENTION

Next, the specific embodiments of the present invention will be explained in detail with reference to drawings.

At first, one example of forming a Cu contact plug in an interlayer insulating film containing a hydrophobic Low-k film material by CMP using the conventional slurry will be described, for explaining problems involved in this conventional method.

On the occasion of forming a Cu multi-wiring layer, a dual damascene (DD) process where via-contact portions and wiring portions are concurrently formed is generally employed. In the case of an insulating film where it is difficult to apply the DD process, another method is adopted wherein contact plugs (via-plugs) are individually formed at first, and thereafter, wiring portions are formed.

In this process, when the CMP is performed for forming the plugs, the area of the insulating film is caused to increase as compared with that on the occasion of forming the wiring portions. Therefore, the wirings are greatly influenced by the insulating film, thereby making it very difficult to secure all of the features demanded of the wirings.

FIGS. 1A to 1E are cross-sectional views illustrating one example of forming such a Cu contact is plug.

Figure 1A:
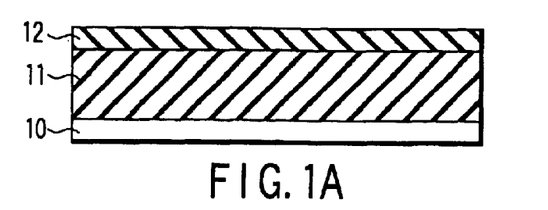
FIGS. 1A to 1E are cross-sectional views each illustrating, in stepwise, the process for forming a Cu contact plug.

First of all, as shown in FIG. 1A, a first low dielectric constant insulating film 11 and a second low dielectric constant insulating film 12 are successively formed on the surface of a semiconductor substrate 10 formed, for example, of silicon and having semiconductor element(s) (not shown) formed thereon.

The first low dielectric constant insulating film 11 may be constituted by a low dielectric constant insulating material having a relative dielectric constant of as low as less than 2.5. For example, this first low dielectric constant insulating film 11 may be formed of at least one film selected from the group consisting of a film having a siloxane skeleton such as polysiloxane, hydrogen silsesquioxane, polyethyl siloxane, methylsilsesquioxane, etc.; a film having, as a major component, an organic resin such as polyarylene ether, polybenzoxazole, polybenzocyclobutene, etc.; and a porous film such as porous silica film. The first insulating film 11 formed of any of these films is fragile in physical strength.

The second insulating film 12 formed on the first insulating film 11 functions as a capping insulating film and may be formed of an insulating material having a larger relative dielectric constant than that of the first insulating film 11. For example, the second insulating film 12 may be formed of at least one insulating material having a relative dielectric constant of 2.5 or more and selected from the group consisting of SiC, SiCH, SiCN, SiOC and SiOCH. The surface of the second low dielectric constant insulating film 12 formed of any of these materials is hydrophobic.

Alternatively, the second insulating film functioned as a capping film may be formed of a hydrophilic material such as SiO, SiOP, SiOF, SiON and SiN, or of any film relatively high in dielectric constant. In this embodiment, the first insulating film 11 was formed by a spin-coating method to thickness of 400 nm, and the second insulating film 12 was formed by the CVD method to thickness of 100 nm.

Figure 1B:
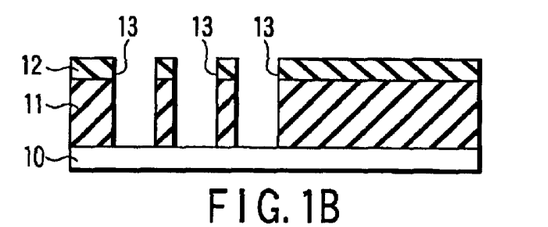

To these first insulating film 11 and second insulating film 12, contact holes 13 were respectively formed to a depth of 500 nm as shown in FIG. 1B.

Figure 1C:
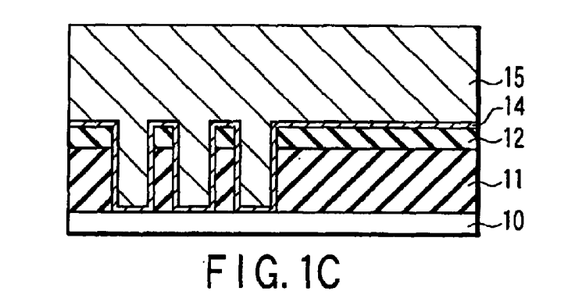

Then, as shown in FIG. 1C, a barrier metal film 14 and a wiring material film 15, both being formed of a conductive material, were successively deposited the entire surfaces of the first and second insulating films 11 and 12. In this embodiment, the barrier metal film 14 was formed by using TaN which was deposited to a thickness of about 10 nm by sputtering. The barrier metal film 14 may be formed of WN, etc., which may be also deposited so as to have almost the same thickness as the aforementioned TaN film. The wiring material film 15 was formed in such a manner that, at first, a Cu seed layer was formed by sputtering method and then, a Cu film was formed thereon to a thickness of about 120 nm by plating method.

Incidentally, in the embodiment shown in FIG. 1C, the insulating film on which the barrier metal film 14 and the wiring material film 15 are formed is formed of a laminate structure containing the first insulating film 11 and the second insulating film 12. The insulating film may not be such a laminate, but may be formed of a single layer of insulating film. The insulating film formed of a single layer in this case may be formed, for example, of black diamond (Applied Materials Co., Ltd.). The surface of the insulating film formed of black diamond also is hydrophobic.

When redundant portions of the conductive layer comprising the barrier film 14 and the wiring material film 15 constructed in this manner are removed by the CMP treatment, a contact plug 16 is formed in the contact holes 13 through the barrier metal 14 formed of TaN. The CMP in this case is performed in two steps, i.e. the removal of the wiring material layer 15 (a first polishing) and the removal of the barrier film 14 (a second polishing).

In the first polishing, the wiring material layer 15 is polished by using a slurry which makes it possible to realize a high-polishing rate of Cu and a slow-polishing rate of TaN, i.e. a slurry which is large in selective ratio between Cu and TaN, in order to secure the planarity of the resultant polished surface. More specifically, the first polishing was performed under the conditions described below.

Slurry: CMS7303/7304 (JSR Co. Ltd.)
Flow rate of slurry: 250 cc/min.
Polishing pad: IC1000 (tradename; RODEL NITTA Co., Ltd.);
Load: 300 gf/cm$^2$.

Figure 1D:
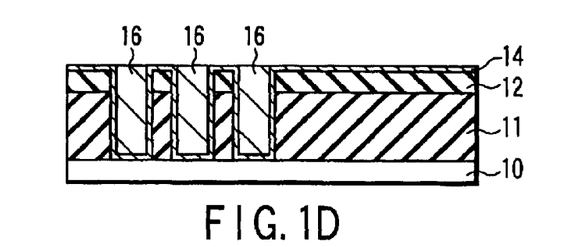
Figure 1E:
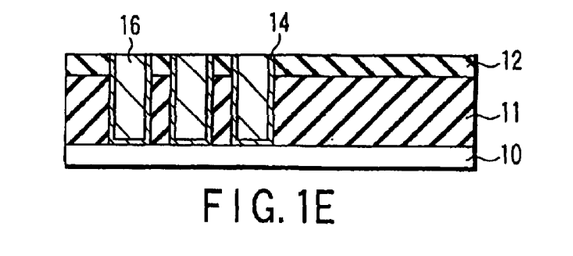

Rotational speed of carrier and turntable were both set to 100 rpm, and the polishing was performed for one minute, thereby removing Cu located on the field and allowing the surface of the barrier metal 14 to expose as shown in FIG. 1D.

The surface of the wafer after the first polishing was covered by the TaN film as the barrier metal film 14 and hence was hydrophilic. Therefore, it was possible to prevent the generation of selective excessive polishing (neck) at the periphery of the pattern of the contact plug 16.

In the second polishing, the barrier metal film 14 was removed to expose the surface of the second insulating film 12 (touch-up CMP), thus finishing the polishing. The slurry employed in this step is required capable of polishing the TaN constituting the barrier metal film 14 at a sufficiently high speed. First of all, the conventional slurry employed for the touch-up was used to perform the touch-up CMP under the following conditions. The slurry employed in this case was formed of an aqueous dispersion comprising 5% by weight of colloidal silica, 1% by weight of quinolinic acid, and 0.1% by weight of hydrogen peroxide, the pH of the dispersion being controlled to 10 by using KOH;

Flow rate of slurry: 200 cc/min;
Polishing pad: IC1000 (tradename; RODEL NITTA Co., Ltd.);
Load: 200 gf/cm$^2$.

Rotational speed of carrier and turntable was set to 100 rpm, and the polishing was performed for 75 seconds.

About 60 seconds later after the initiation of the polishing, the barrier metal film 14 was removed from the second insulating film 12. At this moment, the edge portions of the via-chain pattern where the contact plugs were gathering closely were selectively polished, thereby erosion (neck portion) having a depth of about 45.5 nm generated. When the over-polishing was further continued for 15 seconds, the depth of the erosion was enlarged up to about 78 nm.

The neck formed at the edge portions of the pattern may become a cause for deteriorating the yield of the via-chain and also may give rise to the generation of residual metal on the occasion of performing the CMP of the upper wiring layer, thus inviting the generation of short-circuit due to this residual metal. Therefore, the generation of this neck portion should desirably be prevented as much as possible.

This neck portion is considered to be generated mainly due to a couple of reasons.

Figure 2A:
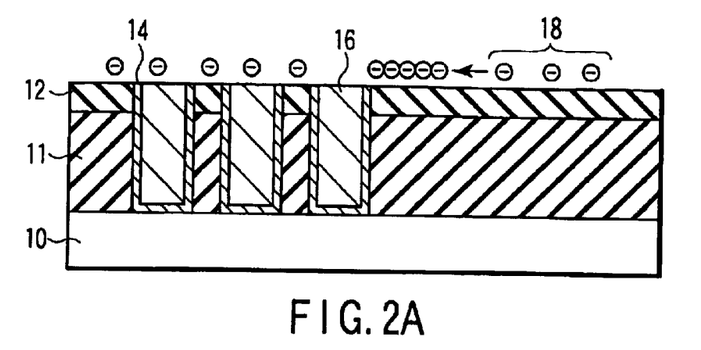
FIGS. 2A and 2B are cross-sectional views illustrating a model of generating a neck portion formed in the prior art.

One of the reasons is, due to the fact that since the Low-k material is hydrophobic, the hydrophilic abrasive grains are incompatible with the Low-k material. Therefore, as shown in FIG. 2A, the abrasive grains 18 are caused to move from the surface of the second insulating film 12 to the surface of the hydrophilic Cu contact plug 16, thereby generating a difference in density of the abrasive grains 18 between the region over the field and the edge portions of the pattern.

Figure 2B:
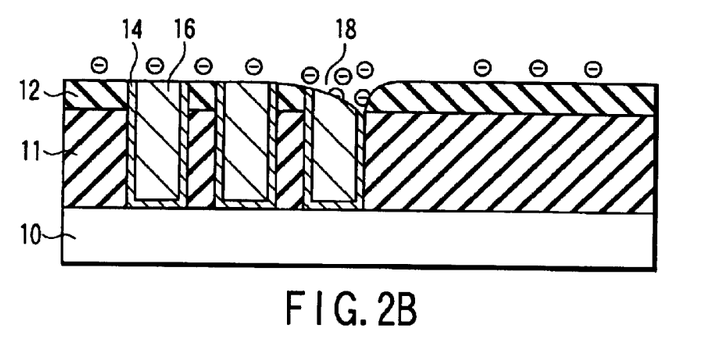

As a result, as shown in FIG. 2B, the abrasive grains 18 are selectively retained at the edge portions of the pattern, thus allowing the polishing to proceed locally and hence resulting in the formation of the neck portion.

The other of the reasons is due to the fact that since the mechanical strength of the Low-k material is relatively poor as compared with the SiO$_2$ film that has been formed by using the ordinary TEOS-based or SiH$_4$-based gas, the polishing rate of the insulating film becomes relatively high.

In the case of the slurry employed in the aforementioned touch-up step, while the ordinary inorganic TEOS insulating film can be polished at a polishing rate of about 30 nm/min, the Low-k film insulating film is enabled to polish at a polishing rate of about 76 nm/min, i.e. twice or more as high as that of the inorganic TEOS insulating film.

Theoretically speaking, it is possible to solve the aforementioned problem by lowering the polishing rate of the Low-k film. In order to realize this, it may be possible to take measures to lower the concentration of abrasive grains in the slurry or to change the kind of polishing particles. In either of these measures, although it is possible to suppress the generation of the neck at the edge portions of the pattern, the polishing rate of the barrier metal film is also concurrently caused to greatly decrease. Specifically, the polishing time of the barrier metal film will be prolonged to four times or more, thus making these measures undesirable from a viewpoint of practicality.

The present inventors have took notice of an idea of enhancing the hydrophilicity of the surface of the Low-k film, and have investigated the characteristics of various surfactants with a view to obtain an optimal surface activity of the Low-k film.

More specifically, aqueous solutions of anionic surfactant, cationic surfactant and nonionic surfactant as shown in the following Table 1, each having a prescribed concentration, were prepared. Then, a semiconductor substrate having the Low-k film formed thereon was immersed in each of aqueous solutions of aforementioned surfactants to investigate the wettability of the surface of the Low-k film.

The wettability of the surface of the Low-k film was evaluated by measuring the contact angle (θ) between the aqueous solution of surfactant and the Low-k film.

Further, each of the surfactants was mixed into the slurry employed in the aforementioned touch-up step at a concentration shown in the following Table 1 to prepare samples of slurries. Then, touch-up CMP was performed under the same conditions as described above except that the samples of slurries prepared as described above were employed to investigate the wettability of the surface of the Low-k film subsequent to CMP.

The results measured of the wettability are summarized in the following Table 1 together with the kind and mixing ratios of the surfactants.

TABLE 1

| Surfactants | | | Wettability | |
| --- | --- | --- | --- | --- |
| Kind of surfactant | | Contents (wt %) | After immersion | After CMP |
| Anionic | Potassium dodecyl benzene sulfonate (DBS) | 10 | ○ | × |
| | Ammonium polycarboxylate (TK-75, Kao Co., Ltd.) | 30 | × | × |
| Cationic | Cetyltrimethyl ammonium chloride | 10 | ◎ | × |
| | Polymer type cation | 35 | ◎ ◎ | × |

TABLE 1-continued

| Surfactants | | | Wettability | |
|---|---|---|---|---|
| Kind of surfactant | | Contents (wt %) | After immersion | After CMP |
| Nonionic | (KD-84, Kao Co., Ltd.) Acetyldiol-based nonion (HLB18) | 10 | ○ | × |
| | Fluorine-based nonion (DS-401, Daikin Co., Ltd.) | 1 | ○ | × |
| | Polyoxyethylene methyl polysiloxane copolymer | 0.1 | ⊚ | ⊚ |
| | Polyvinyl pyrrolidone | 0.8 | ⊚ | × |
| | Not added | | × | × |

Note:
⊚ ⊚: 0° ≦ θ < 45°; ⊚: 45° ≦ θ < 90°; ○: 90° ≦ θ < 150°; ×: 150° ≦ θ < 180°.

Generally, since a surfactant having fluoroalkyl group is capable of sufficiently lowering the surface tension of a solvent, this surfactant is known as having a large degree of surface activating effect. However, as already explained above, the surfactant having fluoroalkyl group cannot be easily handled and hence is not suited for use, from a practical viewpoint.

As shown in above Table 1, the conventional surfactant having an alkyl group in its hydrophobic moiety thereof (for example, cetyltrimethylammonium chloride) is poor in wettability after CMP even though the wettability of the surface of Low-k film obtained after the immersion thereof is generally excellent. The reason for this is assumedly attributed to the following facts. Namely, the conventional surfactant having an alkyl group in its hydrophobic moiety thereof is once adsorbed onto the surface of the Low-k film, thereby enabling the surface of the Low-k film to become hydrophilic. However, since the alkyl group is weak in hydrophobicity, the adsorptive strength thereof to the Low-k film is poor, thereby the surfactant easily desorbs as the surfactant is incapable of withstanding the mechanical stress during the CMP. Therefore, the surfactant having alkyl group in its hydrophobic moiety thereof is incapable of sufficiently hydrophilizing the surface of the Low-k film, thus assumedly making it difficult to sufficiently suppress the generation of the neck.

It has been found that a surfactant having a sufficient degree of hydrophobicity which is higher than that of alkyl group and substantially the same as that of fluoro group and being easy in handling thereof can be selected from silicon-based surfactants. For example, when the touch-up CMP was performed by using a slurry containing 0.1% by weight of polyoxyethylene/methylpolysiloxane copolymer as a silicon-based surfactant, the surface of the Low-k film was enabled to maintain a hydrophilized state even after the CMP, as clearly demonstrated in the above Table 1.

A silicon-based surfactant such as polyoxyethylene/methylpolysiloxane copolymer is capable of exhibiting a high surface activity owing to the water repellency of silicon, and unhazardous to the environment and can be easily handled. Therefore, in the embodiments of the present invention, a slurry containing a silicon-based surfactant was employed. Namely, a slurry containing 0.1% by weight of polyoxyethylene/methylpolysiloxane copolymer was employed in Example 1.

In the touch-up CMP using the slurry of Example 1, it was possible, through 60-second polishing, to remove TaN employed as a barrier metal film and to suppress the neck to a depth of not more than 10 nm at the edge portions of the pattern. Further, even if an overetching was performed another 30 seconds, the neck was substantially prevented from being further enlarged in depth, thereby making it possible to maintain the planarity where irregularity thereof in depth was controlled to not more than 10 nm.

Figure 3:
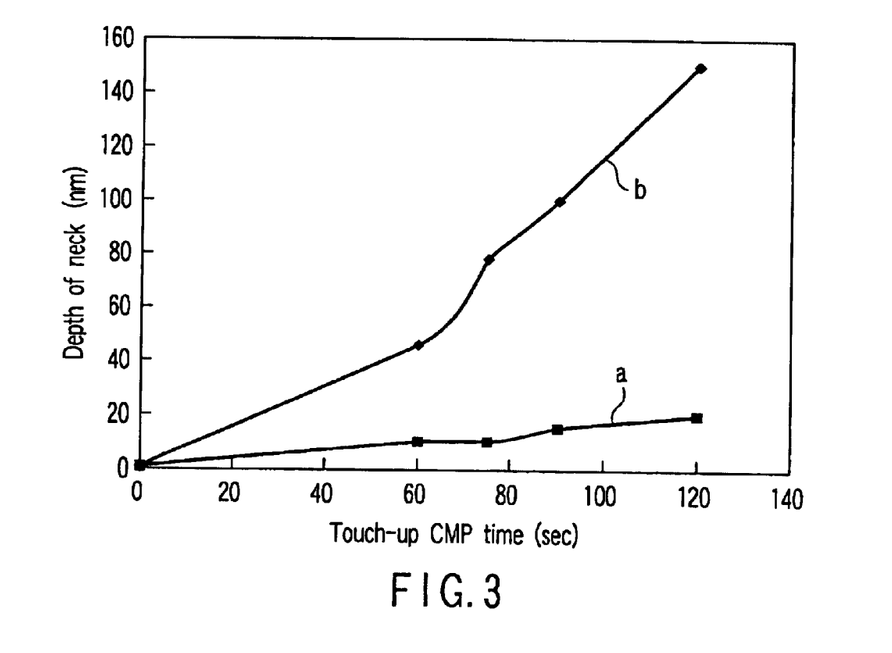
FIG. 3 is a graph illustrating the relationship between the touch-up CMP time and the magnitude of the neck portion.

In the graph shown in FIG. 3, the relationship between the time of the touch-up CMP and the magnitude of the neck portion, which was obtained through the employment of the slurry of Example 1 is represented by a curve "a". As shown in FIG. 3, when the slurry of Example 1 was employed, the magnitude of the neck portion was controlled to not more than 20 nm or so even if the polishing was continued for 120 seconds. Incidentally, if the magnitude of the neck portion is less than about 40 nm, the wiring is not substantially affected by the neck portion. In FIG. 3, the changes in magnitude of the neck portion that may be exhibited when the conventional slurry was employed are represented by a curve "b". The touch-up CMP is generally performed for a period of about 60 seconds. As shown by the curve "b", in the case of the conventional slurry, a neck having a depth of 50 nm was already generated before finishing the touch-up CMP. Moreover, the curve "b" clearly shows that the magnitude of the neck portion was prominently increased with the time of CMP.

Additionally, when the slurry of Example 1 was employed, the polishing rate of the Low-k film was 10 nm/min or so, i.e. about ⅙ of the conventional slurry. Therefore, the Low-k film was inhibited from being preferentially polished, thereby making it possible to minimize the generation of the neck portion.

Figure 4:
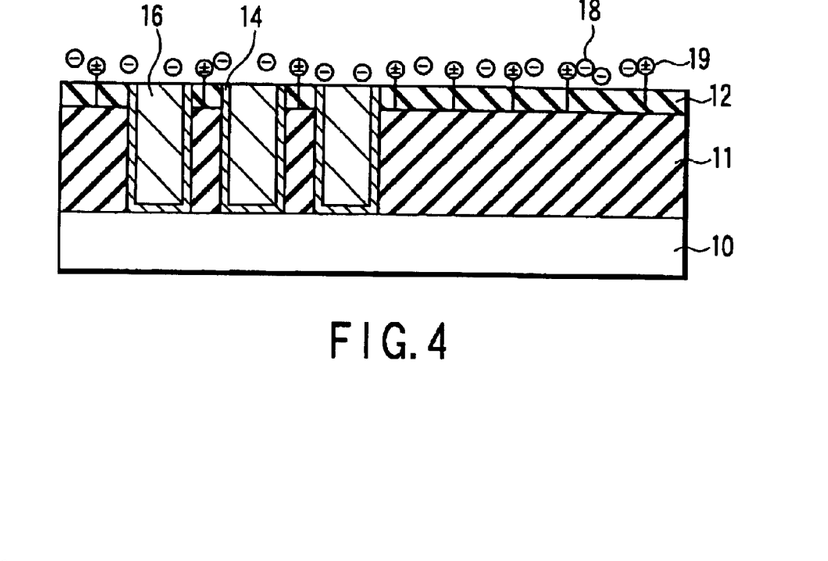
FIG. 4 is a schematic view illustrating a model of suppressing the generation of the neck portion, which can be realized according to embodiments of the present invention.

These effects obtained from the employment of the silicone-based surfactant may be assumedly attributed to the following reasons. Since the silicone-based surfactant is provided with a hydrophobic moiety whose hydrophobicity is very strong, the surfactant strongly adsorbs on the surface of the Low-k film constituting the second insulating film 12 as shown in FIG. 4, thus hydrophilizing the surface of the Low-k film. In FIG. 4, the reference number 19 represents a silicon-based surfactant. Since the surface of the Low-k film 12 can be sufficiently hydrophilized by the application of the silicon-based surfactant, the abrasive grains 18 are prevented from being locally gathered and retained but can be uniformly dispersed all over the Low-k film 12 as well as over the Cu contact plug 16. Due to these reasons, it was possible to prevent the edge portions of the pattern from being preferentially polished, and hence to suppress the generation of the nicking portions.

Additionally, the silicone-based surfactant 19 is also effective in protecting the surface of the Low-k film 12 and capable of forming a uniform covering layer since the silicone-based surfactant 19 is basically formed of silicon, i.e. the same as that of the substrate.

These effects of the silicone-based surfactant can be fully exhibited even against hydrophilic insulating films as well as against non-low dielectric constant insulating films. In this case, micelle is formed on the surfaces of these films to make it possible to enhance the hydrophilicity of these surfaces and hence to improve the wettability of these surfaces.

However, the hydrophile-lipophile balance (HLB) value of the silicone-based surfactant is required to be confined within a predetermined range. Namely, unless the surfactant is capable of being dissolved into an aqueous solution, the surfactant cannot be used for a slurry. Further, even if the surfactant can be strongly adhered to a semiconductor substrate, the effects thereof cannot be derived if the surfactant is lipophile. Therefore, the HLB value of the silicone-based surfactant should specifically be confined within the range of 7 to 20. The HLB value in this case is determined based on Griffin's equation (HLB=20×(weight % of hydrophilic group)). If the HLB value is less than 7, it may become difficult to dissolve the surfactant in an aqueous solution. On the other hand, if the HLB value exceeds over 20, the solubility of the slurry would be increased when the surfactant is incorporated into the slurry, thereby deteriorating the planarity of the surface after polished. Preferably, the HLB value should be confined within the range of 10 to 17.

The HLB value of the polyoxyethylene/methylpolysiloxane copolymer incorporated into the slurry of Example 1 was found 16.

Further, the structure of the hydrophobic moiety having a basic skeleton of silicone oil constituting the base in the silicone-based surfactant may be modified in various ways such as side-chain modification, single-terminal modification, both-terminal modification and both-terminal side-chain modification. On the other hand, the hydrophilic moiety of the surfactant may be nonionic, anionic or cationic. For example, the hydrophilic moiety of the surfactant may be constituted by polyether, betain, sulfate, pyrrolidone or quaternary salt.

The content of the silicone-based surfactant should preferably be within the range of 0.001 wt % to 0.5 wt %. If the content of the silicone-based surfactant is less than 0.001 wt %, it may become difficult to sufficiently hydrophilize the surface of the Low-k film and hence may become difficult to confine the magnitude of the neck portion to the aforementioned acceptable range. On the other hand, if the content of the silicone-based surfactant exceeds over 0.5 wt %, the surfactant may strongly adhere also onto the TaN portion constituting the barrier metal film, thus possibly resulting in an extreme deterioration of the polishing rate of the TaN film.

As for the silicone-based surfactant, it is possible to employ any chemical compounds having, as a skeleton, siloxane straight chain, to which polyoxyalkylene group such as polyoxyethylene, polyoxypropylene, etc. is added. Specific examples of such a compound include polyoxyethylene/methylpolysiloxane copolymer, poly(oxyethylene/oxypropylene) methylpolysiloxane copolymer, polyoxyethylene alkylpolysiloxane/polyoxypropylene alkylpolysiloxane/dimethylpolysiloxane copolymer, and methylpolysiloxane/alkylmethylpolysiloxane/poly(oxyethy lene/oxypropylene) methylpolysiloxane copolymer.

In view of easily obtaining a stable slurry, it is especially preferable to employ polyoxyethylene/methylpolysiloxane copolymer among these copolymers.

As for the abrasive grains employed in the slurry according to the embodiments of the present invention, it is possible to employ, in addition to colloidal silica, at least one material selected from fumed silica, colloidal alumina, fumed alumina, ceria and titanium oxide. The content of the abrasive grains should preferably be within the range of 0.1 wt % to 30 wt %. If the content of the abrasive grains is less than 0.1 wt %, it may become impossible to expect a sufficient degree of polishing action. On the other hand, if the content of the abrasive grains exceeds over 30 wt %, the rate of CMP against the insulating film may become extraordinarily accelerated, thus possibly resulting in difficulty in securing a sufficient selectivity ratio relative to the rate of CMP against Cu.

As for the oxidizing agent which can be incorporated into the slurry as required, it is possible, in addition to hydrogen peroxide, to use at least one material selected from ammonium persulfate, potassium persulfate, ferric nitrate and secondary ammonium cerium nitrate. The content of the oxidizing agent may be selected from the range of 0.1 to 5 wt %.

As for the chelate complexing agent, it is possible to incorporate at least one material selected from quinaldinic acid, quinolinic acid, nicotinic acid, picolinic acid, malonic acid, maleic acid, oxalic acid, succinic acid, citric acid, tartaric acid, malic acid, lactic acid, ammonia, ethylenediamine glycine, alanine and tryptophan. The chelate complexing agent may be incorporated into the slurry at a ratio of about 0.01 wt % to 1 wt %.

Further, it is possible to incorporate a non-silicone-based surfactant. As for the non-silicone-based surfactant, it is possible to employ anionic surfactants such as polyacrylic acid, dodecylbenzene sulfonate, etc.; cationic surfactants such as cetyl ammonium salt, etc.; and nonionic surfactants such as polyoxyethyelene alkylether, etc. When these non-silicone-based surfactants are incorporated into a slurry, the covering state of the surfactant over the surface of the Low-k film would become more uniform, thereby making it possible to further enhance the hydrophilicity of the surface of the Low-k film. In order to sufficiently secure these effects, these non-silicone-based surfactants should preferably be incorporated at a ratio of about 0.001 wt % to 1 wt % for instance.

When resin particles are incorporated into the slurries according to the embodiments of the present invention, the effect of preventing the peeling of Low-k film can be further enhanced.

In addition to the aforementioned problem of neck, the peeling of Low-k film can be mentioned as one of the important problems that should be overcome on the occasion of forming Cu/Low-k damascene wirings. As compared with inorganic insulating films, the Low-k material is generally poor in adhesive strength to other insulating films or barrier metal films. Therefore, on the occasion of CMP, in particular on the occasion of the touch-up CMP, the Low-k material is incapable of withstanding the mechanical stress, thereby the Low-k film easily peels off. The peeling of the Low-k film would be increased more frequently and the scale of the peeling thereof would be also enlarged as the layer to undergo the CMP is placed higher in the laminate structure thereof.

For example, an upper insulating film was formed by using LKD (available from JSR) on a lower insulating film which was formed in advance by using Black Diamond (available from AMJ), and then, the formation of double-layered Cu damascene wirings in these insulating films was tried. When the touch-up CMP of the second-layered wiring was performed by using the conventional slurry, the peeling of film was recognized at about 80% of the entire area of wafer, thus making it difficult to form the wiring.

On the other hand, PMMA (polymethylmethacrylate) particles having a primary particle diameter of 200 nm was incorporated at a ratio of 0.1 wt % into the slurry of the aforementioned Example 1 to prepare the slurry of Example 2. Then, by using this slurry, the touch-up CMP was performed under the same conditions as described above. As a result, the area of film peeling was suppressed to 5% or less. Moreover, the portions where the peeling was generated were all limited to the cut portions of the wafer edges that is non-effective region.

In order to enable the film peeling-suppressing effect to be sufficiently exhibited while securing a high polishing rate of the Low-k film and suppressing the generation of neck, the concentration of the resin particles should preferably be within the range of 0.05 wt % to 1 wt %.

Figure 5:
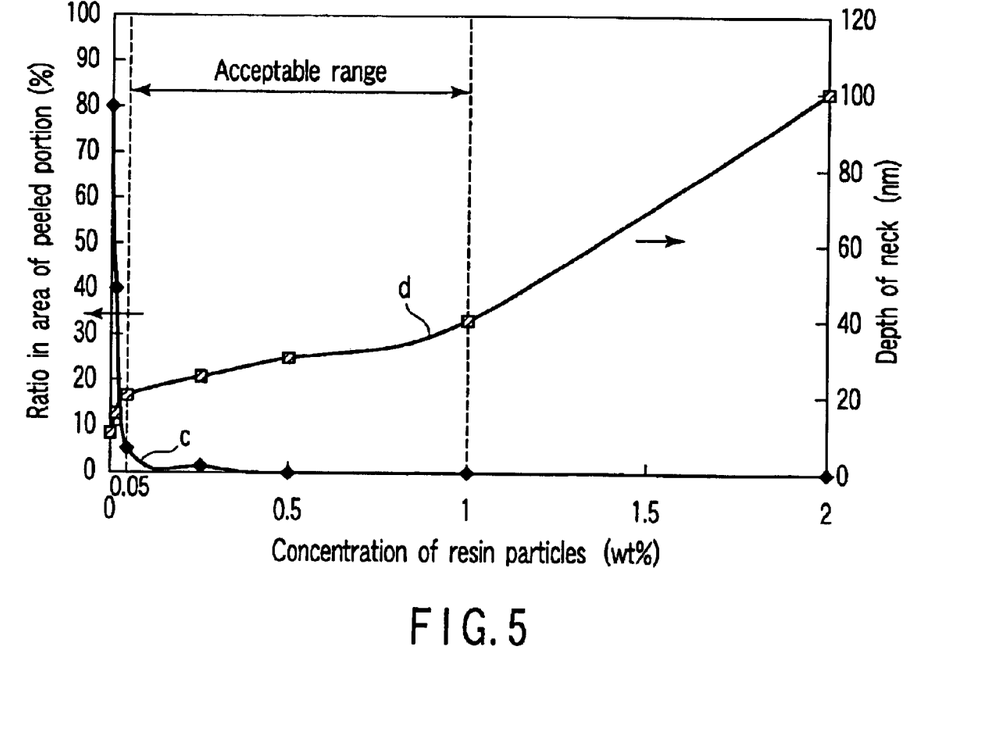
FIG. 5 is a graph illustrating the relationship between the concentration of resin particles and the ratio of peeled area and also the relationship between the concentration of resin particles and magnitude of the neck portion.

In FIG. 5, the relationship between the concentration of resin particles and the ratio in area of the peeled portion is represented by a curve "c" and the relationship between the concentration of resin particles and the magnitude of neck portion is represented by a curve "d". As shown in the curve "c", the ratio in area of the peeled portion was sharply decreased as the concentration of resin particles was increased. With respect to the magnitude of the neck portion, it was increased in proportion to the increase in concentration of resin particles as shown in the curve "d". If the ratio in area of the peeled portion can be confined to 5% or less, it can be disregarded. On the other hand, with respect to the magnitude of the neck, if it can be confined to 40 nm or less, it can be disregarded as already explained above.

When the resin particles are incorporated at a concentration of 0.05 wt % to 1 wt % into the slurry, the ratio in area of the peeled portion as well as the magnitude of neck portion can be suppressed within acceptable ranges, respectively.

Incidentally, as for the materials for the resin particles, it is possible to employ, in addition to methacrylic resin such as PMMA, phenol resin, urea resin, melamine resin, polystyrene resin, polyacetal resin, or polycarbonate resin, all of which having almost the same degree of hardness as that of methacrylic resin.

Abrasive grains may be flocculated or adsorbed onto the surface of the resin particles so as to enable them to be used as composite particles.

If the resin particles are employed as composite particles, the resin particles should. preferably be provided, on their surfaces, with an anionic, cationic, amphoteric or nonionic functional group. Specific examples of these functional groups include hydroxyl group, epoxy group, carboxylic group, etc.

As for the resin particles, it is possible to employ, other than those mentioned above, polymer particles made of thermoplastic resin such as polyvinyl chloride/styrene copolymer, saturated polyester, polyamide, polyimide, polyolefin or polyolefin copolymer such as polyethylene, polypropylene, poly-1-butene, poly-4-methyl-1-pentene, etc., phenoxy resin, acrylic copolymer, etc. It is also possible to employ polymer particles made of thermosetting resin, such as urethane resin, epoxy resin, alkyd resin, unsaturated polyester resin, etc.

Incidentally, copolymers having a hydrophilic functional group in their constituent unit such as styrene/methacrylic copolymer, styrene/maleic anhydride copolymer, etc. are preferable for use, since they are excellent in dispersion in water and hence can be easily formed into an aqueous dispersion. Polyethylene, polypropylene, polystyrene, etc. can be surface-treated by oxygen plasma, etc. to generate a hydrophilic functional group thereon, thereby making it possible to enhance the dispersibility thereof in water.

The aforementioned polymer particles can be synthesized-by polymerizing monomers such as unsaturated aromatic compounds such as styrene, α-methyl styrene, styrene halide and divinyl benzene; unsaturated esters such as vinyl acetate, vinyl propionate; unsaturated nitriles such as acrylonitrile; acrylic esters; methacrylic esters; etc. Further, it is possible to employ monomers such as butadiene, isoprene, acrylic compounds, methacrylic compounds, acrylamide, methacrylamide, N-methylolacrylamide and N-methylolmethacrylamide. These monomers may be employed singly or in combination of two or more kinds.

When any of these resin particles are incorporated into the slurry at a ratio of 0.05 wt % to 1 wt %, the magnitude of the neck portion as well as the peeling can be suppressed within acceptable ranges, respectively.

As explained above, the slurry for CMP according to the embodiments of the present invention comprises abrasive grains as an abrasive component, and a silicone-based surfactant having an HLB value ranging from 7 to 20. Due to the effects of the silicone-based surfactant, it is now possible to enhance the hydrophilicity of the surface of the insulating film and to suppress the generation of the neck during the process of the touch-up CMP.

These effects of the silicone-based surfactant would be exhibited also during the process of removing residual dust left on the surface of the wiring layer immediately after CMP.

The present inventors have considered that it is conventionally believed that the elimination of dust left behind on the surface of the wiring layer immediately after the CMP can be achieved by a combination of four basic effects, i.e. dissolution, chemical effects, mechanical effects and surface activity. For example, it is believed that, owing to the employment of a treating solution comprising a chelate complexing agent for providing chemical effects, a surfactant for providing surface activities, and pure water for dissolving these agents, and owing to the polishing of a treating surface by using a polishing pad while feeding the aforementioned treating solution thereto, mechanical effects can be given to the residual dust.

In particular, if a hydrophobic material such as the Low-k film is treated, the condition of the treating surface that will be obtained through the surface activation thereof is important. Namely, in order to reliably remove the dust left remained on the treating surface, the washing treatment should preferably be performed under the conditions wherein the hydrophobic treating surface is uniformly covered with a surfactant so as to enhance the hydrophilicity of the treating surface.

As already explained above, this washing treatment can be realized by using a treating solution comprising a silicone-based surfactant having an HLB value ranging from 7 to 20 and water dissolving the surfactant.

However, the purpose of this washing treatment is to remove residual materials from the surfaces of wiring layer or of insulating film, so that the polishing of the insulating film such as $SiO_2$ and of a metallic film such as Cu and Ta is not intended to be achieved. Rather, since the insulating film and metallic film should not be polished during this washing treatment using the aforementioned treating solution, no abrasive grain is included in this treating solution. In other words, the polishing rate of the insulating film and metallic film by the effect of this treating solution should be confined to not higher than 10 nm/min. Irrespective of the conditions and the kind of insulating film and metallic film, if the polishing rate of the insulating film and metallic film is confined to less than 10 nm/min, it will be assumed that the insulating film and metallic film are not polished in any substantial degree.

The aforementioned treating solution can be prepared by dissolving the aforementioned silicone-based surfactant in water such as pure water or ionized water.

As for the silicone-based surfactant, it is possible to employ those already explained above at a ratio which is also already explained above. Further, if a chelate complexing agent and non-silicone-based. surfactant are incorporated into the slurry together with the silicone-based surfactant, the aforementioned dust-removing effect can be further enhanced. These additives can be selected from those already explained above at a ratio which is also already explained above. Furthermore, it is also possible to incorporate resin particles into the slurry.

A treating solution containing the aforementioned silicone-based surfactant is applied to a treating surface subsequent to the treatment by CMP, and then, the treating surface is subjected to a mechanical action using a polishing pad, roll or pencil so as to remove residual materials from the surfaces of wiring layer and insulating film, thus making it possible to obtain a semiconductor device having excellent electric properties.

Figure 6A:
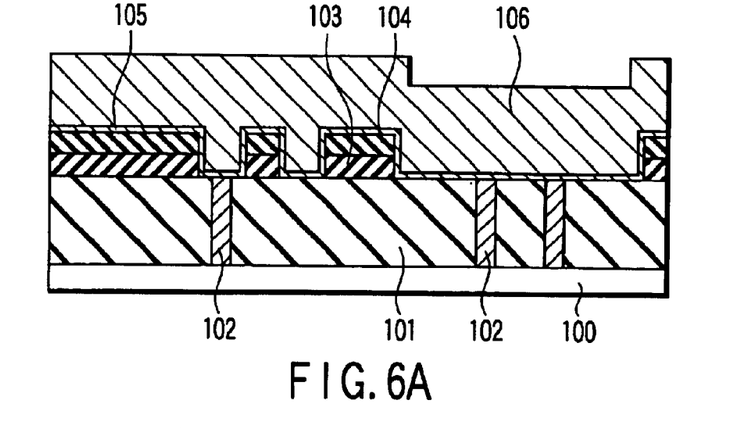
FIGS. 6A to 6C are cross-sectional views each illustrating, in stepwise, the method of manufacturing a semiconductor device according to one embodiment of the present invention.
Figure 6B:
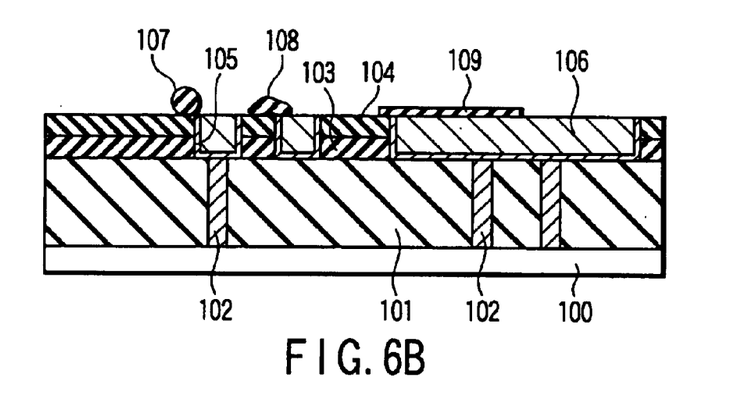
Figure 6C:
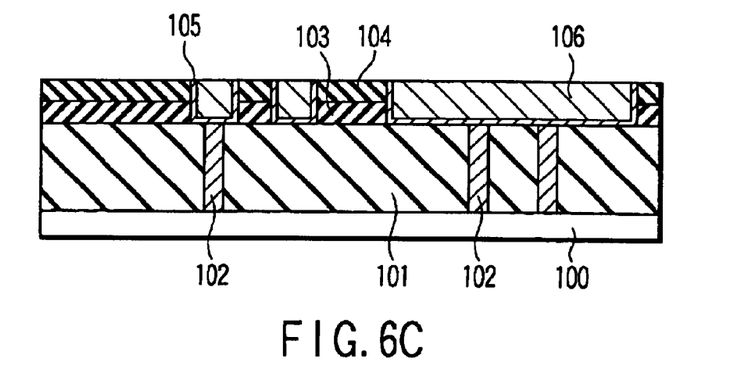

FIGS. 6A to 6C are cross-sectional views each illustrating, stepwise, the method for manufacturing a semiconductor device according to one embodiment of the present invention.

First of all, as shown in FIG. 6A, a barrier metal film 105 and a wiring material film 106 are successively deposited, through an inorganic insulating film 101 and laminated insulating films 103 and 104, on a semiconductor substrate 100 having semiconductor elements (not shown) formed thereon.

A plug 102 made of W (tungsten) is buried in advance in the inorganic insulating film 101. The laminated insulating films are constituted by a first insulating film 103 having a relative dielectric constant of less than 2.5, and a second insulating film 104 formed on the first insulating film 103 and having a relative dielectric constant which is higher than that of the first insulating film 103. The thickness of these first and second insulating films 103 and 104 may be both 100 nm.

The first insulating film 103 can be formed by using a low dielectric constant insulating material having a relative dielectric constant of less than 2.5, specific examples of which are already explained above. The second insulating film 104 can be formed by using an insulating material having a relative dielectric constant of not less than 2.5, specific examples of which are already explained above.

After a wiring groove is formed in the aforementioned laminated insulating films, the barrier metal film 105 and the wiring material film 106 are deposited all over the resultant surface. This barrier metal film 105 may be formed of a Ta film having a thickness of 10 nm, and the wiring material film 106 may be formed of a Cu film having a thickness of 400 nm.

Incidentally, in the embodiment shown in FIG. 6A, the insulating layer on which the barrier metal film 105 and the wiring material film 106 are deposited is constituted by a 2-ply structure consisting of first and second insulating films 103 and 104. However, this insulating layer may be formed of a single insulating film. In such a case, this single insulating film can be formed by using black diamond (Applied Materials Co., Ltd.). The insulating film formed of this material also has a hydrophobic surface.

Then, the redundant portions of the barrier metal film 105 and the wiring material film 106 are removed by CMP until the surface of the second insulating film 104 is exposed, thereby forming a buried wiring layer as shown in FIG. 6B. In this case, CMP was performed in two steps, i.e. a step of removing the wiring material film 106 (1st polishing), and a step of removing the barrier metal film 105 (2nd polishing). The conditions of the CMP were as follows.

(1st polishing)
Polishing slurry: CMS7303/7304 (tradename: JSR Co., Ltd.);
Flow rate of slurry: 250 cc/min;
Polishing pad: IC1000 (tradename: RODEL NITTA Co., Ltd.);
Load: 300 gf/cm$^2$.
Rotational speed of carrier and turntable: 100 rpm.
The polishing was performed for one minute. (2nd polishing)
Polishing slurry: CMS8301 (tradename: JSR Co., Ltd.);
Flow rate of slurry: 200 cc/min;
Polishing pad: IC1000 (tradename; RODEL NITTA Co., Ltd.);
Load: 300 gf/cm$^2$.
Rotational speed of carrier and turntable: 100 rpm.
The polishing was performed for 30 seconds.

As shown in FIG. 6B, residual materials of abrasive grains 107, of metal oxide 108, and of unreacted slurry 109 were adhered on the surfaces of the second insulating film 104, of the barrier metal film 105 and of the wiring material film 106.

These residual materials were washed away by using a treating solution containing the aforementioned silicone-based surfactant to obtain a clean surface as shown in FIG. 6C.

The treating solutions employed herein were prepared according to the following procedures.

Treating solution 1: Polyoxyethylene/methylpolysiloxane copolymer as a silicone-based surfactant was dispersed in pure water at a concentration of 0.5 wt % to prepare the treating solution 1.

Treating solution 2: A chelate complexing agent (citric acid) was incorporated into the aforementioned treating solution 1 at a concentration of 0.3 wt % to prepare the treating solution 2.

Treating solution 3: A non-silicone-based surfactant (polyacrylic acid) was incorporated into the aforementioned treating solution 1 at a concentration of 0.01 wt % to prepare the treating solution 3.

By using these treating solutions, the surface under the condition shown in FIG. 6B was washed. In this washing, the semiconductor substrate sustained on a carrier was permitted to contact a polishing pad (about 10000 nm in roughness; RODEL NITTA Co., Ltd.) placed on the turntable under a load of 300 gf/cm$^2$ and the carrier as well as the turntable were revolved at a rotational speed of 100 rpm. Each of the treating solutions was fed to the surface of the polishing pad at a flow rate of 300 cc/min to perform the washing for a period of 15 to 60 seconds.

Since it becomes difficult to remove the residual materials once the treating surface is allowed to dry, the washing should preferably be performed under the condition wherein the treating surface is always kept in a wet state. Namely, it is desirable that upon finishing the 2nd polishing, the washing should be successively performed by using the same apparatus.

In place of the washing using a polishing pad, the washing can be performed also by roll washing or pencil washing.

Furthermore, the surface under the condition shown in FIG. 6B was washed in the same manner as described above except that the following treating solutions 4 to 6 were employed substituting for the aforementioned treating solutions 1 to 3.

Treating solution 4: Only pure water.
Treating solution 5: Pure water containing 0.3 wt % of citric acid.
Treating solution 6: Pure water containing 0.01 wt % of polyacrylic acid.

The treating solution 6 corresponds to the conventional treating solution.

After the washing treatment, the yield based on short-circuit of wiring (line/space: 0.08 $\mu$m/0.08 $\mu$m) was investigated, and at the same time, the I–V characteristics of the insulating film was measured from the value of leak current (applied electric field: 1MV/cm) of the wiring, the results obtained being summarized in the following Table 2.

TABLE 2

|  | Yield based on short-circuit (%) | Leak current (nA) |
| --- | --- | --- |
| Treating solution 1 | 95 | 8 |
| Treating solution 2 | 99 | 2 |
| Treating solution 3 | 99 | 3 |
| Treating solution 4 | 65 | 6548 |
| Treating solution 5 | 72 | 873 |
| Treating solution 6 | 75 | 664 |

As shown in Table 2, it was possible, through the washing using the treating solutions 1 to 3 each containing the aforementioned silicone-based surfactants respectively, to improve the electric characteristics of the resultant semiconductor devices. More specifically, the yield based on short-circuit of wiring was increased to 95% or more, and the leak current was reduced to 8 nA or less.

Incidentally, when the concentration of the silicone-based surfactants was altered within the range of 0.001 to 1.0 wt %, almost the same effects were obtained.

It is believed from these results that it was possible, through the washing using the treating solutions containing the aforementioned silicone-based surfactants respectively, to give mechanical action (without imposing any excessive load on the hydrophobic and fragile organic insulating film) to dust and residual matters that may become a cause for deterio-rating the electric characteristics of a semiconductor device, thereby making it possible to effectively remove the dust and residual matter without generating scratches on the treating surface.

Incidentally, in the generation where the design rule is in the order of 0.1 $\mu$m, it is required that the yield based on short-circuit of wiring is 95% or more, and the leak current is confined to less than 10 nA. It is now possible, through the employment of a treating solution containing the aforementioned silicone-based surfactants, to cope with the design rule of the next generation.

Whereas, when a treating solution containing no silicone-based surfactants was employed, the yield based on short-circuit of wiring was limited to at most 75%, and the leak current was increased up to 6500 nA at maximum. The reasons for this may be attributed to the fact that since dust, etc. was not completely removed, an insufficient performance was obtained.

The washing using the treating solutions containing the aforementioned silicone-based surfactants can be also applied in the same manner as described above to a damascene wiring employing Al and W, thus obtaining almost the same effects as described above. Further, the treating solutions containing the aforementioned silicone-based surfactants can be also employed for the post treatment after CMP of poly-Si, $SiO_2$, etc., wherein the treating surface can be effectively washed so as to provide a clean surface.

The washing using the treating solutions containing the aforementioned silicone-based surfactants can be also employed in combination with the touch-up CMP using the slurries according the embodiments of the present invention. In this case, it is possible to minimize the generation of the neck portions at the edges of pattern and to concurrently obtain a clean surface, thus making it possible to obtain excellent results.

As explained above, according to embodiments of the present invention, it is now possible to provide slurries for CMP and a method of manufacturing a semiconductor device, which make it possible to form a damascene wiring where the density of defects as well as the concentration of surface impurities can be minimized.

Further, according to the present invention, it is now possible to manufacture a semiconductor device of high-performance and high-processing speed and having fine wirings of 0.1 $\mu$m of less in design rule which is to be demanded in the wirings of the next generation. Therefore, the present invention is highly valuable, from an industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:

forming an insulating film above a semiconductor substrate;

forming a recessed portion in said insulating film;

depositing a conductive material inside said recessed portion and on said insulating film to form a conductive layer; and removing the conductive material deposited on said insulating film by CMP using a CMP slurry to expose said insulating film, said CMP slurry comprising a solvent, abrasive grains and a silicone-based surfactant having an HLB value ranging from 7 to 20.

2. The method according to claim 1, wherein said silicone-based surfactant included in said CMP slurry comprises at least one copolymer selected from the group consisting of polyoxyethylene/methylpolysiloxane copolymer, poly(oxyethylene/oxypropylene) methylpolysiloxane copolymer, polyoxyethylene alkylpolysiloxane/ polyoxypropylene alkylpolysiloxane/dimethylpolysiloxane copolymer, and methylpolysiloxane/ alkylmethylpolysiloxane/poly(oxyethy lene/oxypropylene) methylpolysiloxane copolymer.

3. The method according to claim 1, wherein the content of said silicone-based surfactant in said CMP slurry is within the range of 0.001 wt % to 0.5 wt %.

4. The method according to claim 1, wherein said CMP slurry further comprises at least one component selected from the group consisting of an oxidizing agent, a chelate complexing agent and a non-silicone-based surfactant.

5. The method according to claim 1, wherein said conductive layer is formed by successively depositing a barrier metal and Cu.

6. The method according to claim 1, wherein said insulating film is formed by forming a first insulating film having a relative dielectric constant of less than 2.5 and forming a second insulating film on the first insulating film, said second insulating film having a relative dielectric constant higher than that of the first insulating film.

7. A method for manufacturing a semiconductor device comprising:

forming an insulating film above a semiconductor substrate;

forming a recessed portion in said insulating film;

depositing a conductive material inside said recessed portion and on said insulating film to form a conductive layer;

removing said conductive material deposited on said insulating film to expose said insulating film while selectively leaving said conductive layer deposited inside said recessed portion, thereby forming a buried wiring layer; and treating surfaces of said buried wiring layer and of said insulating film by using a treating solution comprising a silicone-based surfactant having an HLB value ranging from 7 to 20 and dissolved in water.

8. The method according to claim 7, wherein said conductive layer is formed by successively depositing a barrier metal and Cu.

9. The method according to claim 7, wherein said insulating film is formed by forming a first insulating film having a relative dielectric constant of less than 2.5; and forming a second insulating film on the first insulating film, said second insulating film having a relative dielectric constant higher than that of the first insulating film.

10. The method according to claim 7, wherein said silicone-based surfactant in said treating solution has an HLB value ranging from 10 to 17.

11. The method according to claim 7, wherein said silicone-based surfactant included in said treating solution comprises at least one copolymer selected from the group consisting of polyoxyethylene/methylpolysiloxane copolymer, poly(oxyethylene/oxypropylene) methylpolysiloxane copolymer, polyoxyethylene alkylpolysiloxane/polyoxypropylene alkylpolysiloxane/dimethylpolysiloxane copolymer, and methylpolysiloxane/alkylmethylpolysiloxane/poly(oxyethy lene/oxypropylene) methylpolysiloxane copolymer.

12. The method according to claim 7, wherein the content of said silicone-based surfactant in said treating solution is within the range of 0.001 wt % to 1.0 wt %.

13. The method according to claim 7, wherein a polishing rate of said insulating film and said conductive layer by said treating solution is 10 nm/min or less.

* * * * *